(12) United States Patent
Monzyk

(10) Patent No.: US 10,955,109 B1
(45) Date of Patent: Mar. 23, 2021

(54) PORTABLE LIGHTING DEVICE

(71) Applicant: Courtney Joseph Monzyk, Davenport, IA (US)

(72) Inventor: Courtney Joseph Monzyk, Davenport, IA (US)

( * ) Notice: Subject to any disclaimer, the term of this patent is extended or adjusted under 35 U.S.C. 154(b) by 117 days.

(21) Appl. No.: 15/908,444

(22) Filed: Feb. 28, 2018

Related U.S. Application Data

(63) Continuation-in-part of application No. 14/644,140, filed on Mar. 10, 2015, now abandoned, which is a continuation-in-part of application No. 13/178,484, filed on Jul. 7, 2011, now abandoned.

(60) Provisional application No. 61/361,921, filed on Jul. 7, 2010.

(51) Int. Cl.

| | |
|---|---|
| *F21V 9/00* | (2018.01) |
| *F21V 9/14* | (2006.01) |
| *F21L 4/00* | (2006.01) |
| *F21L 4/04* | (2006.01) |
| *F21V 5/00* | (2018.01) |
| *F21L 4/02* | (2006.01) |
| *F21V 5/04* | (2006.01) |
| *F21Y 115/10* | (2016.01) |
| *H01L 33/50* | (2010.01) |
| *F21V 14/02* | (2006.01) |
| *F21V 14/06* | (2006.01) |
| *F21V 7/00* | (2006.01) |
| *F21Y 101/00* | (2016.01) |

(52) U.S. Cl.
CPC .............. *F21V 5/006* (2013.01); *F21L 4/027* (2013.01); *F21V 5/04* (2013.01); *F21V 7/0075* (2013.01); *F21V 14/025* (2013.01); *F21V 14/065* (2013.01); *F21Y 2101/00* (2013.01); *F21Y 2115/10* (2016.08); *H01L 33/504* (2013.01)

(58) Field of Classification Search
CPC .......... F21V 5/006; F21V 5/04; F21V 7/0075; F21V 14/025; F21V 14/065; F21L 4/027; F21Y 2101/00; F21Y 2115/10; H01L 33/504
See application file for complete search history.

(56) References Cited

U.S. PATENT DOCUMENTS 6,190,022 B1   2/2001  Tocci et al.
7,006,223 B2   2/2006  Mullani
(Continued)

OTHER PUBLICATIONS

Luxeon Rebel color line, Lumileds, pamphlet. DS68 Luxeon Rebel Color Line Product Datasheet © 2017 Lumileds Holding B.V. All rights reserved. (Year: 2017).*

*Primary Examiner* — Bijan Ahvazi
(74) *Attorney, Agent, or Firm* — Hamilton IP Law, PC; Jay R. Hamilton; Charles Damschen

(57) ABSTRACT

A portable light may employ a light source positioned adjacent an optical element. The light source may be configured as a light emitting diode generating light with a wavelength primarily within the range of 530 nm to 700 nm with a relative peak intensity of 550 nm to 650 nm. The optical element may be configured to manipulate the emitted light into a beam or other light pattern having specific characteristics such as a certain diameter and/or shape, a certain amount of spill, and/or a certain amount of backscatter. Certain embodiments may be especially useful for emergency and rescue operations performed under conditions such as fire generated smoke.

17 Claims, 16 Drawing Sheets

(56) References Cited

U.S. PATENT DOCUMENTS

| | | | | |
|---|---|---|---|---|
| 7,204,606 B2* | 4/2007 | Brass | ............... | G01N 21/31 |
| | | | | 362/184 |
| 8,042,967 B2* | 10/2011 | Hikmet | ............... | F21V 14/003 |
| | | | | 362/208 |
| 8,790,253 B2* | 7/2014 | Sunagawa | ............ | A61B 1/0638 |
| | | | | 362/227 |
| 2009/0128028 A1* | 5/2009 | Hildenbrand | ............ | H01L 33/44 |
| | | | | 313/507 |
| 2010/0027246 A1* | 2/2010 | Petersen | ............... | B24B 23/005 |
| | | | | 362/119 |
| 2010/0085727 A1* | 4/2010 | Igarashi | ............ | G02F 1/133603 |
| | | | | 362/84 |

\* cited by examiner

FIG. 6

PORTABLE LIGHTING DEVICE

CROSS REFERENCE TO RELATED APPLICATIONS

This application is a continuation-in-part of and claims priority from U.S. patent application Ser. No. 14/644,140 filed on Mar. 10, 2015, which application was a continuation-in-part of and claimed priority from U.S. patent application Ser. No. 13/178,484 filed on Jul. 7, 2011, which application claimed priority from provisional U.S. Pat. App. No. 61/361,921 filed on Jul. 7, 2010, all of which applications are incorporated by reference herein in their entireties.

FIELD OF THE INVENTION

The present invention relates to the field of portable lights, and more specifically to portable lights that may be used in emergency and/or rescue situations.

STATEMENT REGARDING FEDERALLY SPONSORED RESEARCH OR DEVELOPMENT

No federal funds were used to develop or create the disclosed invention.

REFERENCE TO SEQUENCE LISTING, A TABLE, OR A COMPUTER PROGRAM LISTING COMPACT DISK APPENDIX

Not Applicable

BACKGROUND OF THE INVENTION

Lighting devices carried into emergency situations currently utilize either filtered or unfiltered full spectrum or substantially monochromatic light sources. In the case of full spectrum light sources, if the source is not filtered then it contains light having short wavelengths below about 550 nm. If a full spectrum light source is filtered, then the overall luminous output must be decreased by the filter element(s). Luminous efficacy and overall power efficiency are important in portable lighting devices such as flashlights in order to minimize size and weight while maximizing light output and device runtime; therefore, it is undesirable to use a filtered full spectrum light source to obtain a spectrum of light similar to that produced by the portable lighting device disclosed herein.

Substantially monochromatic light sources, such as light emitting diodes (LEDs) made from gallium arsenide phosphide, aluminum gallium indium phosphide, gallium (III) phosphide, aluminum gallium arsenide, etc. can all produce light relatively efficiently, but the emitted wavelengths fall within a narrow range of the spectrum, and therefore produce poor visibility due to diminished color rendition and depth perception. A graph providing typical spectral distributions for various LEDs is shown in FIG. 1.

LEDs may be desirable for use in portable lighting devices due to their high luminous efficacy, but until recently have either produced white light containing a large proportion of wavelengths below about 550 nm or have been substantially monochromatic. The problem with using filtered full spectrum LEDs in order to obtain a spectrum of light similar to that produced by the portable lighting device disclosed herein is that the luminous efficacy of the device would be greatly reduced since full spectrum LEDs emit a significant proportion of light at wavelengths below about 550 nm and filtering these wavelengths results in much less available light for use.

Night vision equipment is also in use by emergency response personnel, but suffers from numerous disadvantages, including but not limited to, limited situational awareness due to poor peripheral vision, fogging and discomfort caused by heat accumulation and perspiration, high power requirements and high cost.

Rayleigh scattering dictates that light of shorter wavelengths will be scattered to a greater degree than light of longer wavelengths by particles suspended in a medium, such as air, having a diameter on the same order of size as that of the incident light wavelength. In an environment containing a large number of suspended particles, such as with fine dust or smoke, longer wavelengths of light are scattered less than shorter wavelengths. This relationship explains why the sky is blue and sunsets are red. Air molecules are smaller than most smoke particles, and in this regime Raleigh scattering is no longer valid, so Mie theory must be used to understand the interaction between the particles and electromagnetic waves such as visible light. A typical distribution of the size of smoke particles (in microns) is shown in FIG. 5, and FIG. 6 provides a graph showing scattering of light by smoke particles of various sizes.

The results of Mie theory are more difficult to interpret than Rayleigh scattering. Scattered light is highly undesirable in a smoke-filled rescue environment because it obscures vision of the user, affecting their ability to find or discern a person in need of rescue and maintain situational awareness for their own safety.

Human vision is known to be a function of the wavelength of light. Rods and cones within the retina and fovea of the eye each have different sensitivities to light as wavelength is varied. The rods provide for the scotopic response to light, and peak relative sensitivity for rods occurs around 507 nm. The cones provide for the photopic response to light, and peak relative sensitivity of cones occurs around 555 nm. For light intensities reaching the eye that are less than about 0.1 lux, the rods are responsible for vision. When a light source provides a light intensity to the eyes in the range of about 0.1 to 10 lux, both rods and cones contribute to vision. For light intensities in excess of about 10 lux, vision is dominated by the contribution from cones. Thus, in the range of lower light intensity from about 0.1 to 10 lux, the peak relative intensity is shifted to shorter wavelengths compared to brighter light sources over about 10 lux. A graphical representation of the typical relative luminous efficiency (on a logarithmic scale) for rods and cones as a function of the wavelength of the light is shown in FIG. 2, and FIG. 3 provides a semi-graphical representation of the type of vision and/or eye components used by a typical person in various conditions. Finally, FIG. 4 provides a graphical representation of the threshold intensity of a typical person's sight after a certain time without visible light.

Light comprising a portion of the beam outside of the substantially brighter center (spill) is of a low enough intensity that it would contribute very little to sight in a smoky or dusty environment due to attenuation and scattering, yet it would still contribute to backscatter that only serves to reduce visibility of the target. A graphical representation of backscatter efficiency as a function of diameter of smoke particles (in microns) is shown in FIG. 7, and FIG. 8 provides a graph of the ratio of penetrating to backscattered light intensity as a function of the distance to target (in meters) for various wavelengths of light. A graph of the ratio of penetrating to backscattered light intensity (as a percent improvement relative to 450 nm light) as a function to the distance to the target (in meters) for various wavelengths of light is shown in FIG. 9. Furthermore, light that forms the spill of a beam is light that could be used to increase the intensity of the center portion of the beam, which will aid in penetration and increase the distance of useful illumination.

BRIEF SUMMARY OF THE INVENTION

An illustrative embodiment of a portable lighting device may employ a light source positioned adjacent an optical element, such as a reflector or collimator. Light may be generated with wavelength primarily within the range of 550 nm to 700 nm. In one embodiment the light preferably has a relative peak intensity of 550 nm to 650 nm. The light may be reflected, or it may be collimated into a beam with minimal spill. At least in part because the results of Mie theory are more difficult to interpret than Rayleigh scattering, and the unexpected benefits of the portable lighting device have not yet been discovered or reported.

Generally, certain embodiments of the portable lighting device disclosed and claimed herein solve the problem of being blinded by white light scattering off airborne smoke particulates or other similarly sized particulates suspended in a fluid by utilizing phosphor-converted amber LEDs. These LEDs may provide the highest light efficacy while emitting a light spectrum that may minimize the region of the visible spectrum most reflected off said particulates, and may simultaneously provide for good color rendition, depth perception, and penetration into said fluids.

Other objects, advantages, and novel features of the portable lighting device will become apparent from the following detailed description of the invention when considered in conjunction with the accompanying drawings.

BRIEF DESCRIPTION OF THE SEVERAL VIEWS OF THE DRAWINGS

The accompanying drawings, which are incorporated in and constitute a part of this specification, illustrate embodiments and together with the description, serve to explain the principles of the portable lighting device.

FIG. 6 provides a graph showing scattering of light by smoke for smoke particles of various sizes.

DETAILED DESCRIPTION OF THE INVENTION

Figure 1:
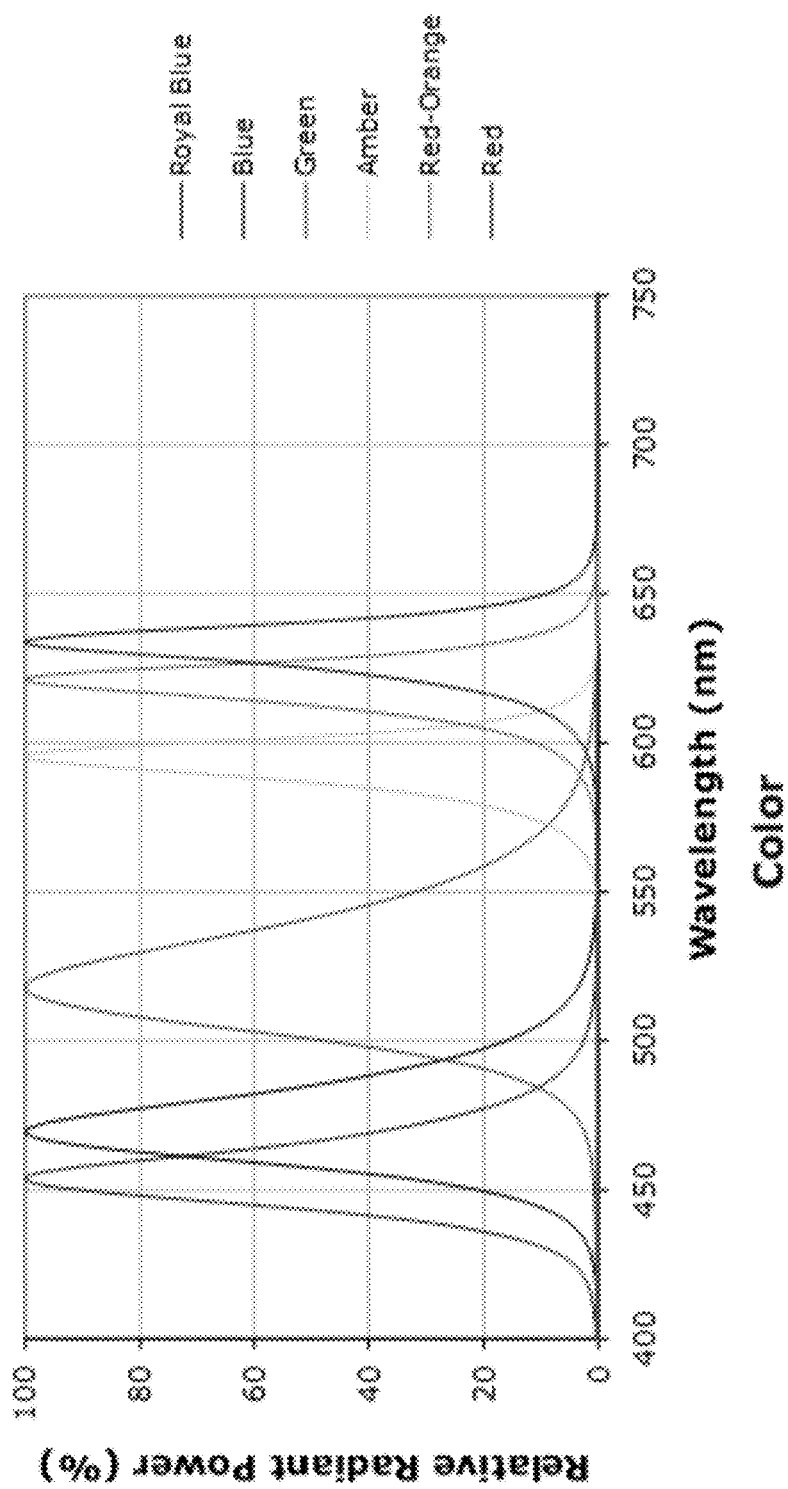
FIG. 1 is a graph providing typical spectral distributions of various LEDs.

Before the present portable lighting device is disclosed and described, it is to be understood that the portable lighting device is not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes. As used herein, the term "luminescence" refers to both fluorescence and phosphorescence, i.e. photon emission due to relaxation of excited electrons.

Disclosed are components that can be used to perform the disclosed portable lighting device. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all portable lighting devices. This applies to all aspects of this application including, but not limited to, components of a portable lighting device. Thus, if there are a variety of additional components that can be added it is understood that each of these additional components can be added with any specific embodiment or combination of embodiments of the disclosed portable lighting device.

The present portable lighting device may be understood more readily by reference to the following detailed description of preferred embodiments and the examples included therein and to the Figures and their previous and following description.

Theory of Operation/Design

Figure 2:
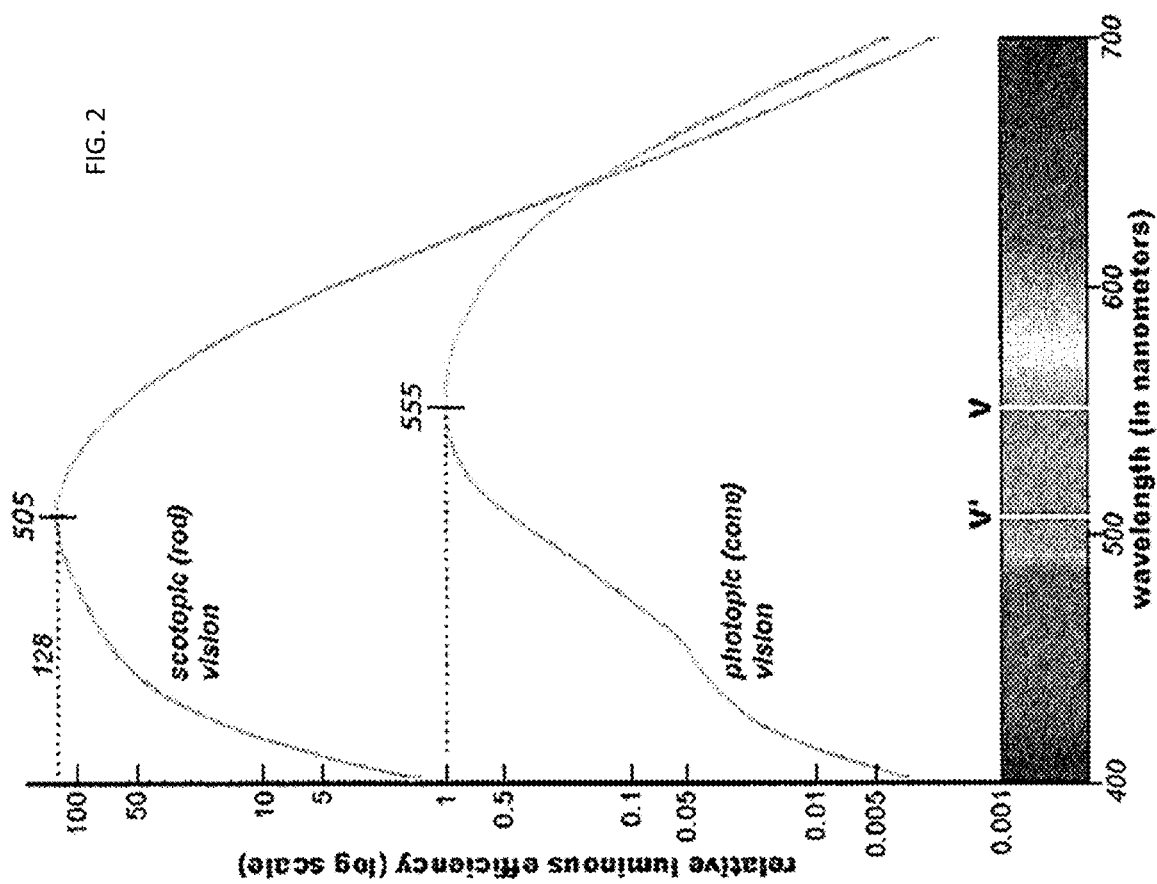
FIG. 2 is a graphical representation of the typical relative luminous efficiency (on a logarithmic scale) for rods and cones as a function of the wavelength of the light.
Figure 3:
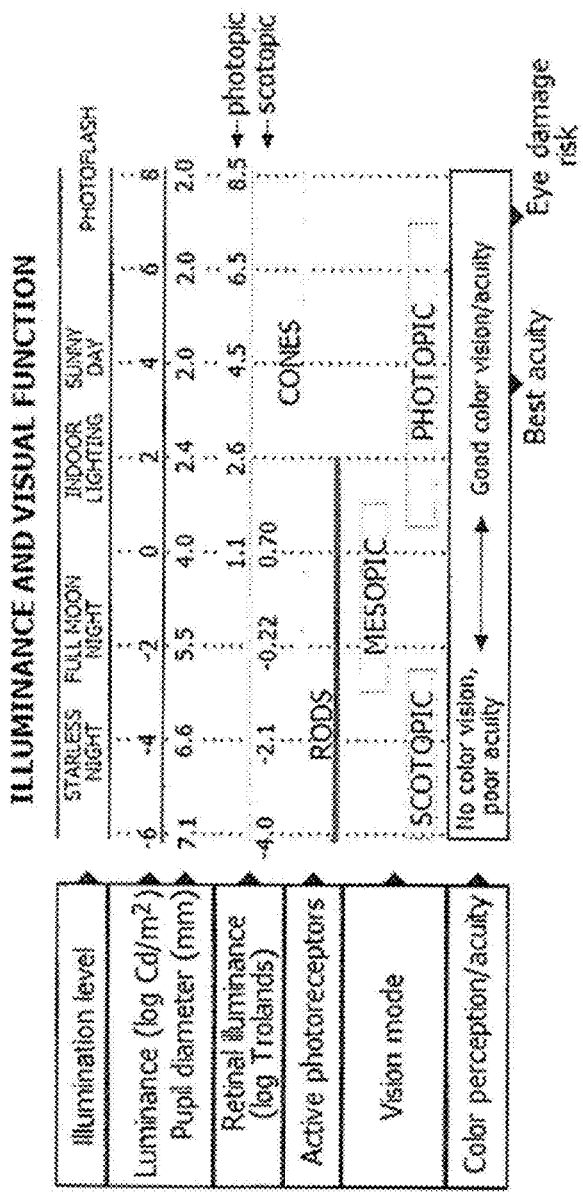
FIG. 3 provides a semi-graphical representation of the type of vision and/or eye components used by a typical person in various conditions.
Figure 4:
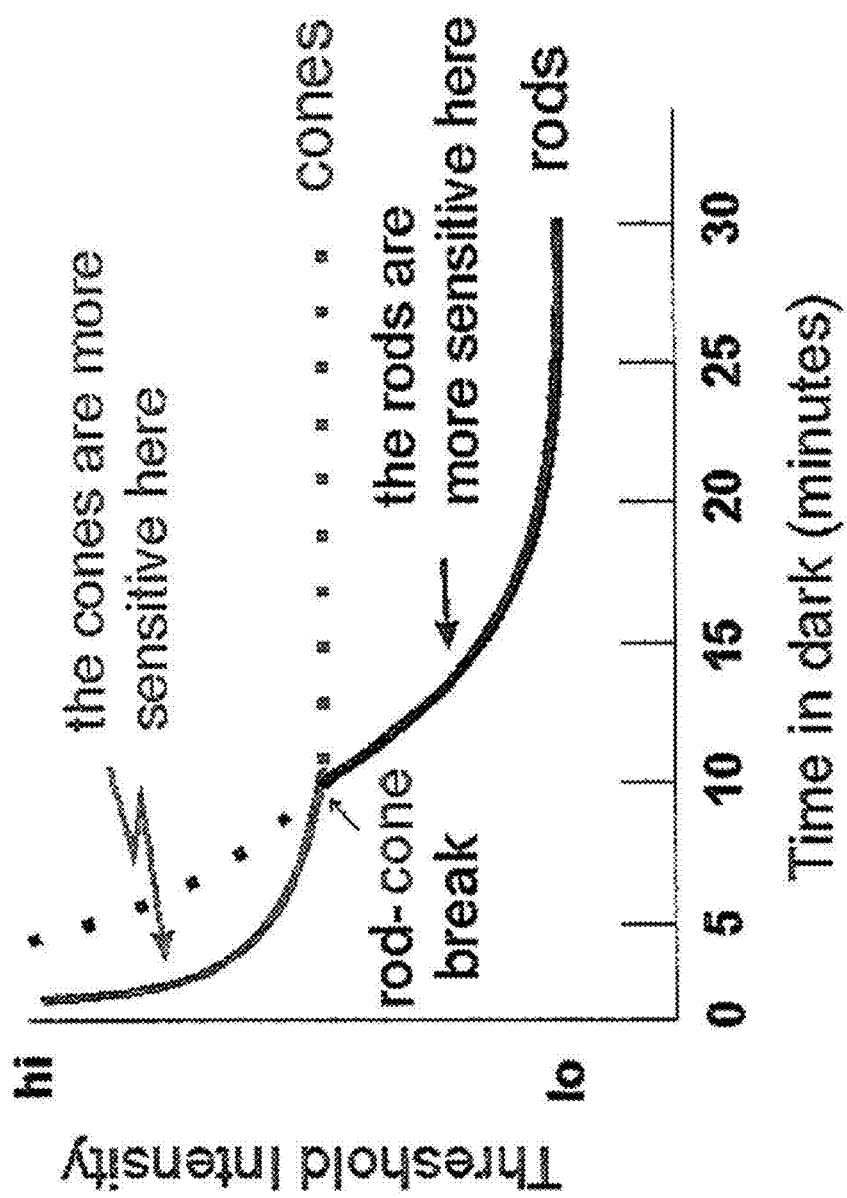
FIG. 4 provides a graphical representation of the threshold intensity of a typical person's sight after a certain time without visible light.

As can be seen in FIG. 2 (which provides the relative luminous efficiency comparing rods (scotopic) in low light and cones (photopic) in brighter light), a light wavelength of between approximately 500 and 550 nm may be optimal from the standpoint of being perceived with relatively high efficacy by both rods and cones simultaneously. From FIG. 3, this would apply to light having a luminance in the range of approximately 0.001 to 10 Cd/m2 (which roughly corresponds to a moonless, clear night and twilight, respectively). Accordingly, an illustrative embodiment of a portable lighting device may emit over 25 lumens per LED with a corresponding illuminance of over 5 lux at 1 meter per LED. This embodiment should yield a light that a human may primarily perceive with cones or the photopic response. Because human eyes generally require time to adjust to using rods for low-light situations (see FIG. 4), a simple reflection of the light emitted by the portable lighting device from a nearby object may effectively reduce the user's scotopic response. Therefore, the user of an illustrative embodiment of the portable lighting device may primarily be utilizing cones or photopic visual component in an actual emergency and/or rescue situation. Consequently, peak sensitivity to light may occur at about 555 nm. Of note, cones generally provide much greater visual acuity than rods (see FIG. 3).

Figure 5:
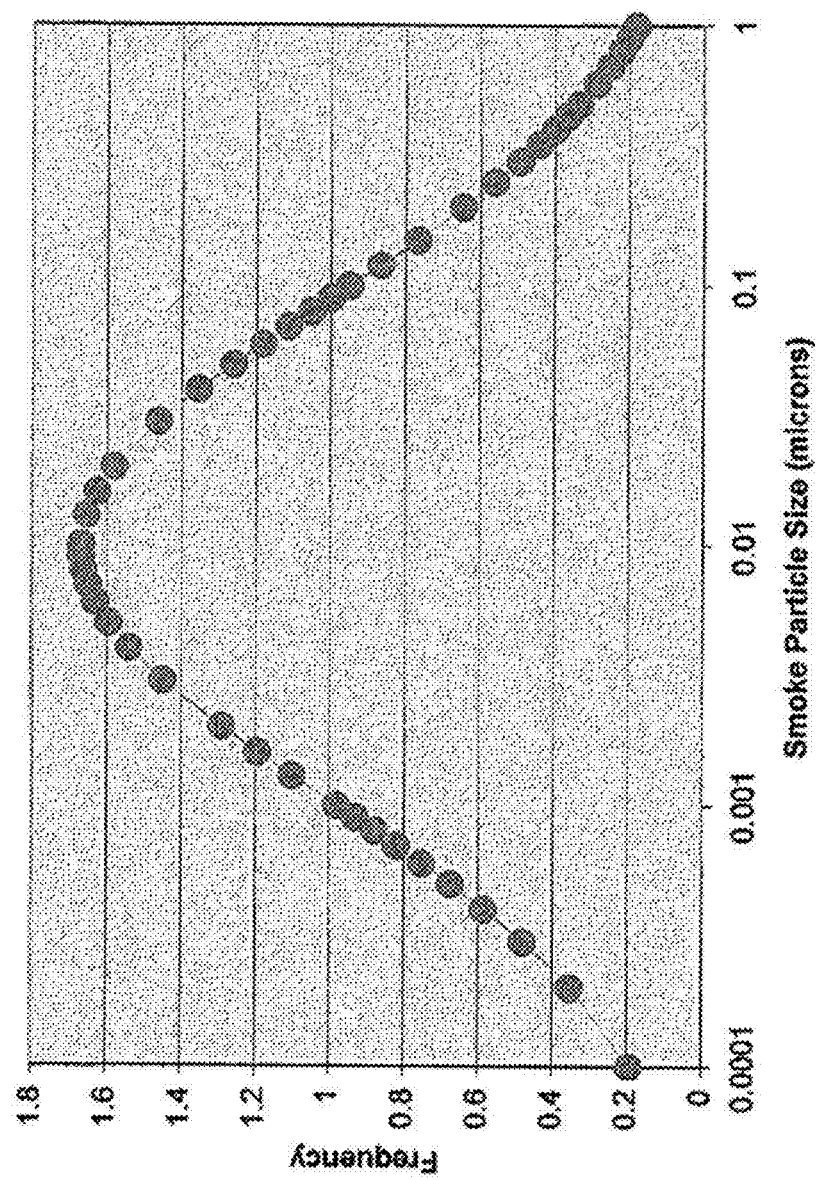
FIG. 5 provides a distribution of the size of smoke particles (in microns).

However, this information in isolation is insufficient to allow one to select an optimal wavelength of light, at least because light attenuation by smoke may be a function of wavelength, and any light scattered back to the eyes of the user can overwhelm the user's vision and prevent the user from seeing a target some distance beyond the source of the backscattered light. Therefore, Applicant has conducted an in-depth analysis of light interaction with smoke particles. First, Applicant has analyzed information about the distribution of sizes of the smoke particles and their real and imaginary indices of refraction, wherein a typical distribution of smoke particles based on size is shown in FIG. 5. Through research and review of *Revised algorithm for estimating light extinction from* IMPROVE *particle speciation data*, Journal of the Air & Waste Management Association, November, 2007 and *Retrieval of the real part of the refractive index of smoke particles from Sun/sky measurements during SCAR-B*, Journal of Geophysical Research, Vol. 103, No. D24, pp. 893-31, 902, 1998 (both of which references are incorporated by reference herein in their entireties, Applicant has determined that the real component of refractive index for smoke particles (organic mass) of 1.55. The references above also indicate that the imaginary component of refractive index for smoke particles (organic mass) is 0, and that the particle size distribution of freshly produced smoke having a log-normal mass size distribution with geometric mean of 0.2 microns and geometric standard deviation of 2.2 microns (as shown graphically in FIG. 5).

Figure 6:
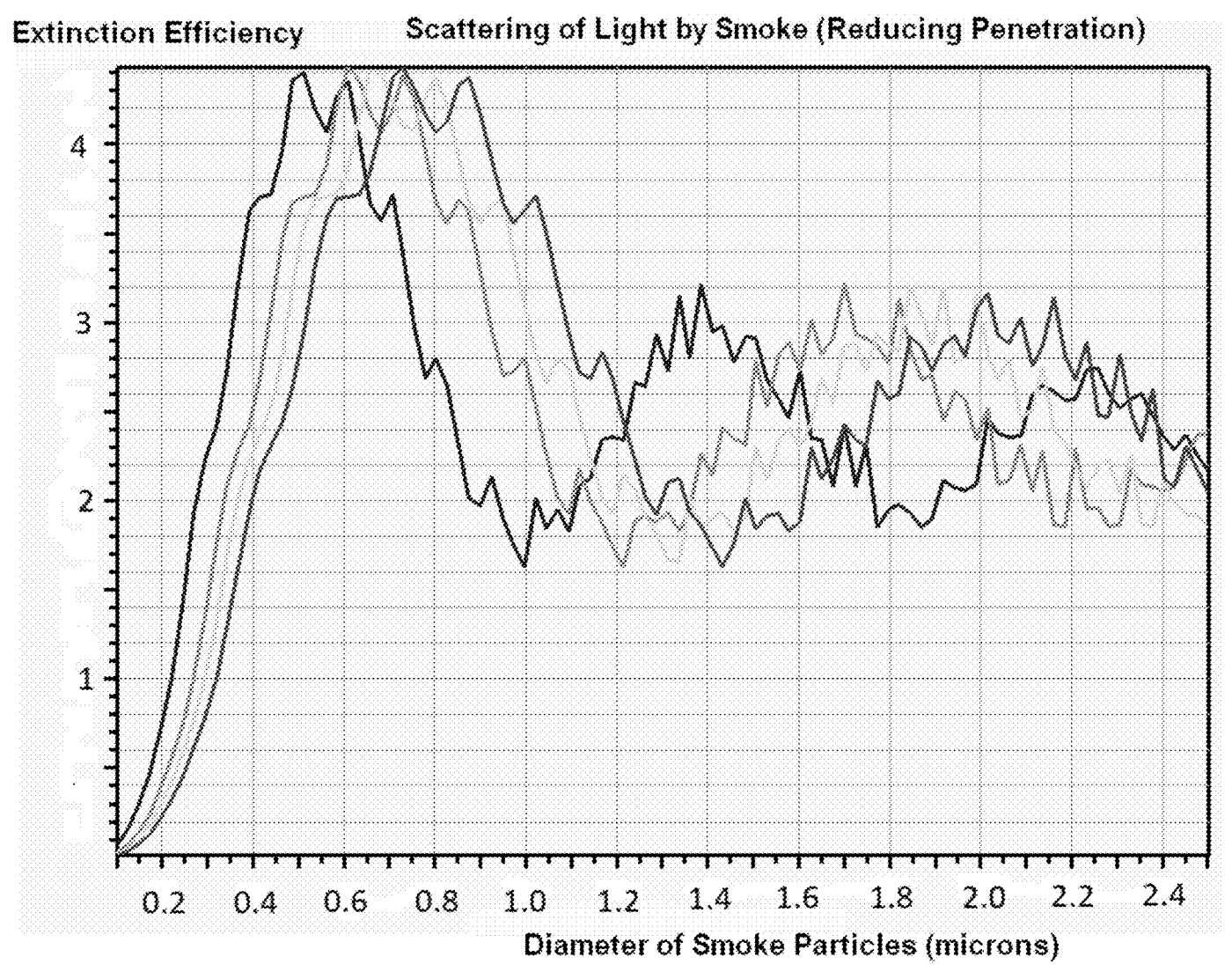
Figure 7:
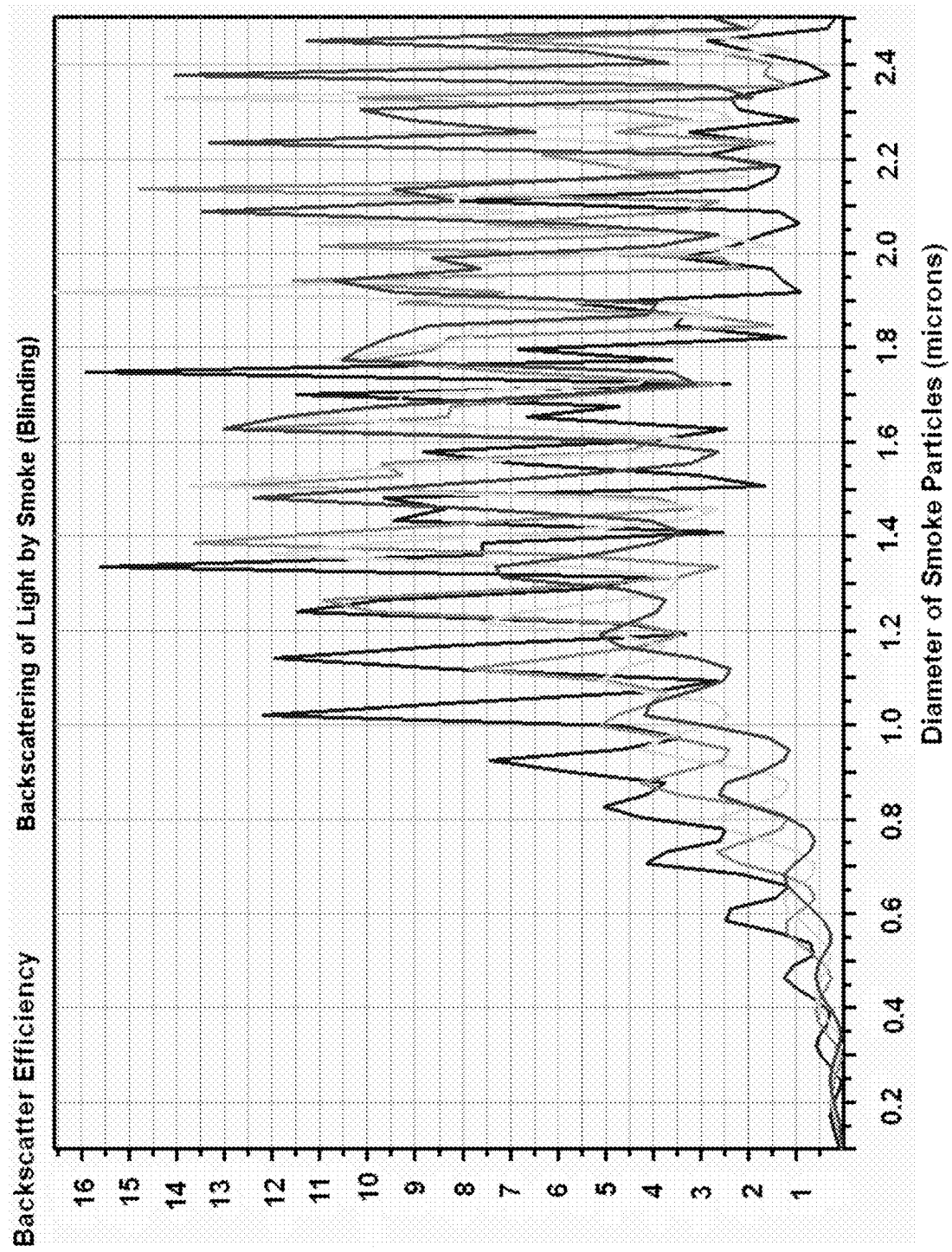
FIG. 7 provides a graphical representation of backscatter efficiency as a function of diameter of smoke particles (in microns).

Since the smoke particle diameters are not much smaller than the wavelengths of visible light, simple Rayleigh scattering may not accurately model the interaction. For wavelengths of light on the order of the diameter of the smoke particles, Mie theory may be used to consider the interactions. For the Mie theory calculations, Applicant assumed an index of refraction for the medium (air) of 1.0003 and used MieCalc 1.3 to generate values for extinction efficiency and backscattering efficiency as a function of particle size for the range of 0.01 to 2.5 microns for the specific wavelengths of 400, 450, 500, 550, 600, and 650 nanometers. These wavelengths approximately correspond to the colors violet, blue, cyan, green, yellow, and red respectively. The extinction efficiency results for wavelengths of 450, 550, 600, and 650 nanometers are shown in FIG. 6, while FIG. 7 shows the backscattering efficiency results for the same wavelengths. These results are very difficult to interpret graphically, and it is not at all obvious from FIGS. 6 & 7 that some wavelengths of light are interacting more or less with smoke particles than others, so Applicant performed further analysis.

The next step in data analysis Applicant performed was to convert the efficiencies to coefficients according to these equations:

$$\epsilon_{ext} = N\sigma_{ext} = N\left(\frac{\pi D^2}{2}\right)Q_{ext}$$

$$\epsilon_B = N\sigma_B = N\left(\frac{\pi D^2}{2}\right)Q_B$$

Where N is the number concentration of the particles with diameter D. Next, Applicant used the Beer-Lambert law to calculate the fraction of light penetrating the smoke as a function of distance in the case of the extinction coefficient, or being backscattered as a function of distance in the case of the backscattering coefficient. In each case Applicant assumed a smoke particle concentration of 1×10^12 particles per cubic meter. This is the form of the Beer-Lambert law Applicant used to calculate penetration into the smoke:

$$\frac{I}{I_0} = \exp(-\epsilon_{ext}z)$$

Where I is the light intensity at any distance z attenuated by the smoke with extinction $\epsilon_{ext}$ and $I_0$ is the incident intensity.

In the case of backscattered light, it was not necessary to determine the intensity of light penetrating the smoke, but rather the intensity backscattered, so Applicant used the equation:

$$\frac{I}{I_0} = 1 - \exp(-\epsilon_b z)$$

At this point, Applicant applied the inverse square law to determine the extent to which the intensity of light decreased with distance for both penetrating and backscattered light. This was straightforward for penetrating light since the form is simply:

$$I_1 = (I/2r_2)^2/r_1^2$$

The situation may be more complex for the case of backscattered light since incident light intensity may be much lower if it is backscattered at a greater distance. Conversely, light scattered directly or nearly directly in front of the user may be much more intense and blinding. Therefore, for each distance the sum of backscattered light must be computed as an integral:

$$I_B = \int I/l^2 dl$$

Where I is the intensity of light reaching distance l. In the case of this analysis, Applicant approximated the integral by a Riemann sum. Next, Applicant computed a ratio of light penetrating the smoke to that backscattered by the smoke for each wavelength and smoke particle diameter. Averages over all smoke particle diameters were taken for each wavelength and the results are plotted in FIG. 8, which clearly shows that shorter wavelengths of light cause more backscattering compared to the extent to which they will penetrate the smoke.

Figure 8:
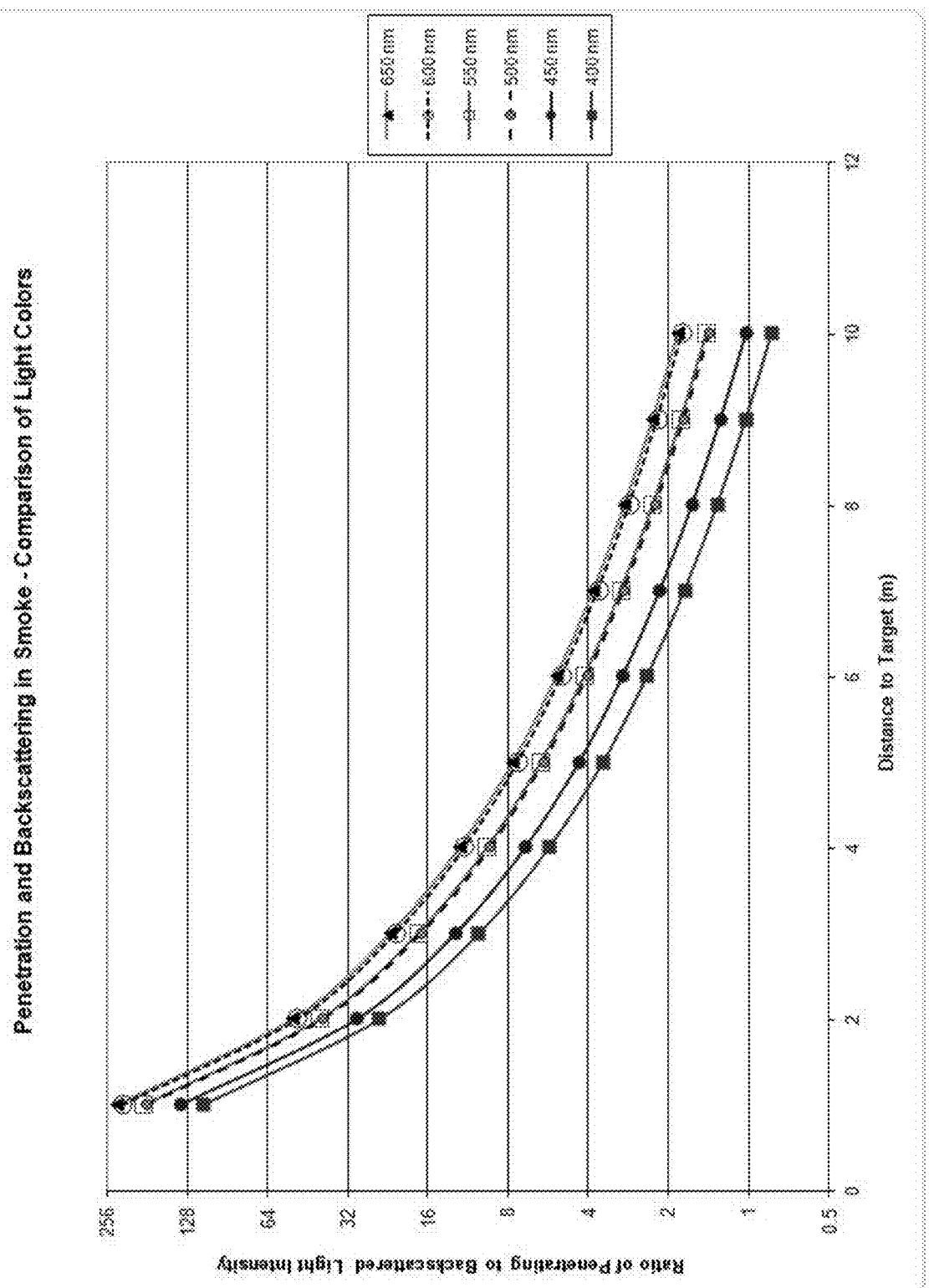
FIG. 8 provides a graph of the ratio of penetrating to backscattered light intensity as a function of the distance to target (in meters) for various wavelengths of light.
Figure 9:
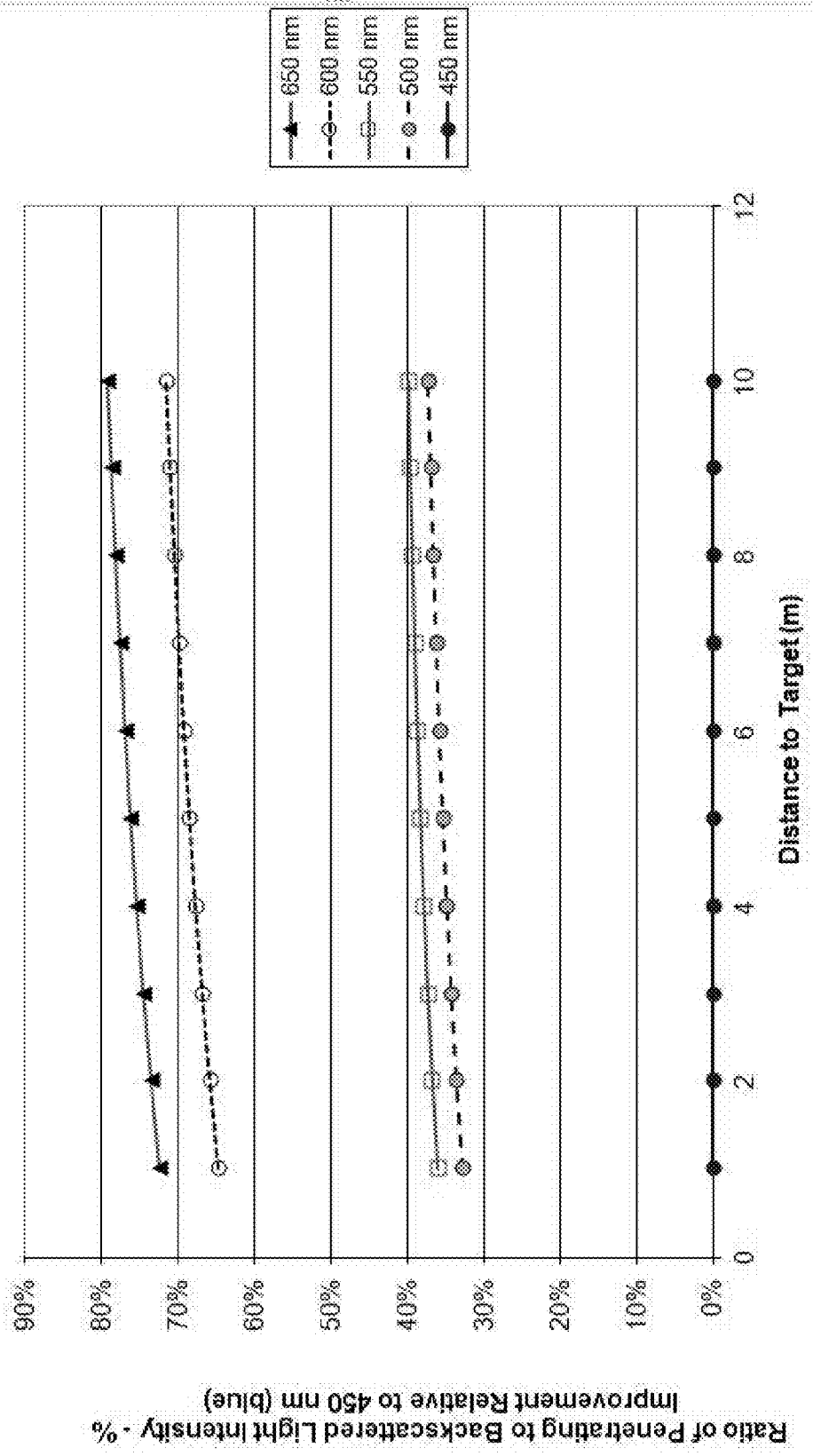
FIG. 9 is a graph of the ratio of penetrating to backscattered light intensity (as a percent improvement relative to 450 nm light) as a function to the distance to the target (in meters) for various wavelengths of light.
Figure 10:
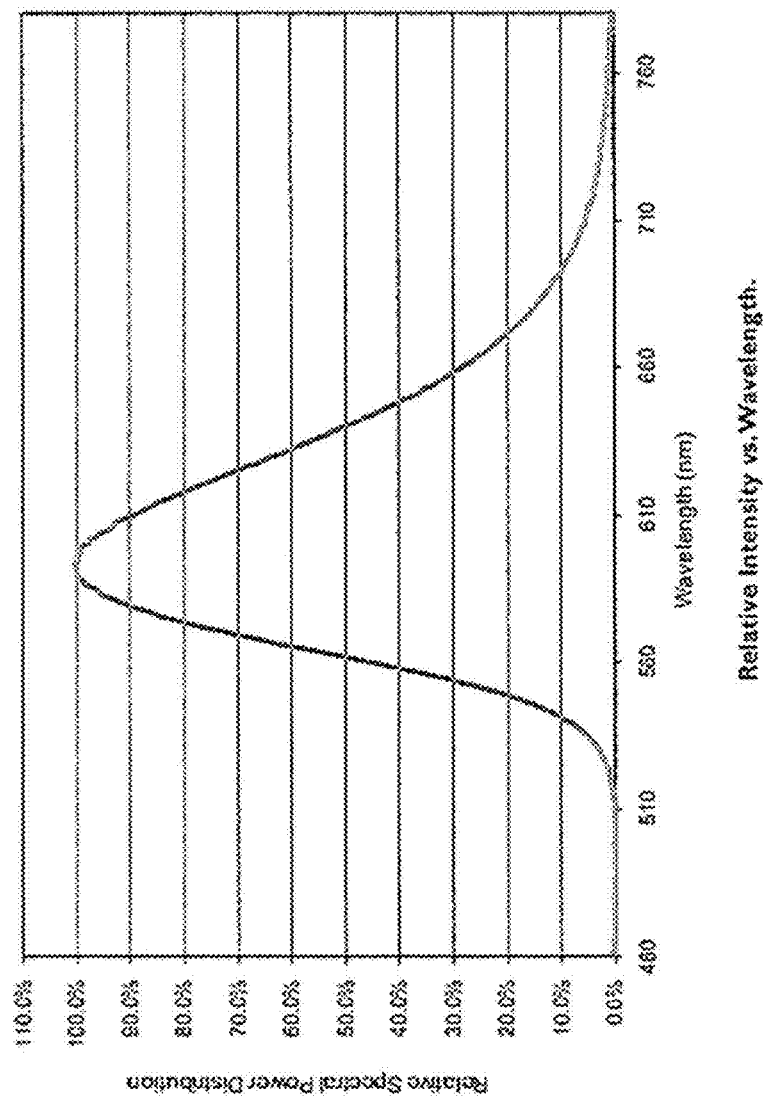
FIG. 10 provides a graphical representation of the relative power spectral distribution for one LED that utilizes phosphors that convert substantially monochromatic light into a range of wavelengths substantially above about 550 nm.

In order to make the unexpected advantage of the portable lighting device even more clear Applicant analyzed the data shown in FIG. 8 to compare the extent to which wavelengths of light greater than 450 nm may be relatively advantageous for seeing in a smoky environment. A result of this comparison is depicted graphically in FIG. 9, which shows the percentage of improvement in the ratio of penetrating to backscattering light for each of the wavelengths studied as compared to blue (450 nm). FIG. 10 shows the relative power spectral distribution for one LED that utilizes phosphors that convert substantially monochromatic light into a range of wavelengths that fall substantially above about 550 nm. Since this LED emits very little light below 550 nm, it produces much less backscattering compared to light sources containing shorter wavelengths while simultaneously providing good penetration through smoke as shown in FIGS. 8 & 9. As the relative spectral power distribution depicted in FIG. 10 falls within a range of wavelengths that provide relatively high luminous efficiency to cones within the retina of the eye (as shown in FIG. 2), it follows that the light produced by this LED may be relatively easily seen, even at relatively low intensities.

Detailed Description of an Illustrative Embodiment

The illustrative embodiment of a portable lighting device may employ a new class of LED assembly that may utilize phosphors that convert substantially monochromatic light into a range of wavelengths that fall substantially above about 550 nm. In a preferred embodiment of the portable lighting device, the light thus produced may fall primarily within the range of 530 nm to 700 nm with a peak relative intensity in the range of 550 to 650 nm. This distribution of light may provide a balance between the photopic and scotopic responses with respect to wavelength and the extent to which shorter wavelengths may be more scattered by suspended particles having a diameter on the same order of size as that of the incident light wavelength. The embodied range of wavelengths may balance these competing effects in order to provide minimized scattering of light while maximizing visual sensitivity to the light.

Figure 14:
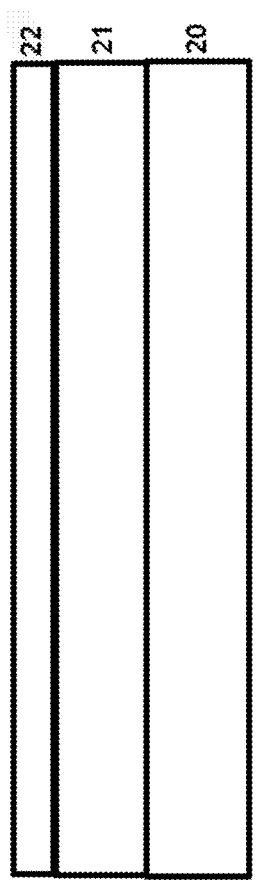
FIG. 14 is a schematic side view of an illustrative embodiment of an LED assembly that may be used to produce light for the device.

One LED assembly suitable for use in producing the previously described distribution of light (which LED assembly is depicted schematically in FIG. 14) is comprised of a first light source 20 on which may be arranged a luminescent material 21 on which may further be arranged a filter material 22. The first light source is comprised of a light emitting diode which produces blue light. On the light-emitting surface of the first light source 20 may be arranged a luminescent material (also called a phosphor layer). The object of the luminescent material 21 is to receive at least part of the blue light emitted through the light-emitting surface of the first light source 20, and to convert at least part of the blue light into a converted light of a higher wavelength. The luminescent compounds (phosphors) suitable for use in producing the previously described distribution of light for use as a luminescent material 21 includes, but is not limited to, YAG:Ce and (Sr, Ca)2SiO4:Eu and aluminum garnet phosphors with the general formula $(Lu_{1-x-y-a-b}Y_xGd_y)_3(Al_{1-z}Ga_z)_5O_{12}{:}Ce_aPr_b$ wherein $0<x<1$, $0<y<1$, $0<z\leq 0.1$, $0<a\leq 0.2$ and $0<b\leq 0.1$, such as $Lu_3Al_5O_{12}{:}Ce^{3+}$ and $Y_3Al_5O_{12}{:}Ce^{3+}$; $SrSi_2N_2O_2{:}Eu^{2+}$; $(Sr_{1-u-v-x}Mg_uCa_vBa_x)(Ga_{2-y-z}Al_yIn_zS_{su-b-4}){:}Eu^{2+}$ including, for example, $SrGa_2S_4{:}Eu^{2+}$; and $Sr_{1-x}Ba_xSiO_4{:}Eu^{2+}$ and $Lu_{3-x-y}M_yAl_{5-z}A_zO_{12}{:}Ce_x$ where M=Y, Gd, Tb, Pr, Sm, Dy; A=Ga, Sc; and $(0<x\leq 0.2)$; $Ca_{3-x-y}M_ySc_{2-z}A_zSi_3O_{12}{:}Ce_x$ where M=Y, Lu; A=Mg, Ga; and $(0<x\leq 0.2)$; $Ba_{2-x-y}M_ySiO_4{:}Eu_x$ where M=Sr, Ca, Mg and $(0<x\leq 0.2)$; $Ba_{2-x-y-z}M_yK_zSi_{1-z}P_zO_4Eu_x$ where M=Sr, Ca, Mg and $(0<x\leq 0.2)$; $Sr_{1-x-y}M_yAl_{2-z}Si_zO_{4-z}N_z{:}Eu_x$ where M=Ba, Ca, Mg and $(0<x\leq 0.2)$; $M_{1-x}Si_2O_2N_2{:}Eu_x$ where M=Sr, Ba, Ca, Mg and $(0<x\leq 0.2)$; $M_{3-x}Si_6O_9N_4{:}Eu_x$ where M=Sr, Ba, Ca, Mg and $(0<x\leq 0.2)$; $M_{3-x}Si_6O_{12}N_2{:}Eu_x$ where M=Sr, Ba, Ca, Mg and $(0<x\leq 0.2)$; $Sr_{1-x-y}M_yGa_{2-z}Al_zS_4{:}Eu_x$ where M=Ba, Ca, Mg and $(0<x\leq 0.2)$; $Ca_{1-x-y-z}M_yS{:}Ce_xA_y$ where M=Ba, Sr, Mg; A=K, Na, Li; and $(0<x\leq 0.2)$; $Sr_{1-x-z}M_zAl_{1+y}Si_{4.2-y}N_{7-y}O_{0.4+y}{:}Eu_x$ where M=Ba, Ca, Mg and $(0<x\leq 0.2)$; $Ca_{1-x-y-z}M_ySc_2O_4{:}Ce_xA_z$ where M=Ba, Sr, Mg; A=K, Na, Li; and $(0<x\leq 0.2)$; $M_{x-z}Si_{6-y-2x}Al_{y+2x}O_yN_{8-y}{:}Eu_z$ where M=Ca, Sr, Mg and $(0<x\leq 0.2)$; and $Ca_{8-x-y}M_yMgSiO_4Cl_2{:}Eu_x$ where M=Sr, Ba and $(0<x\leq 0.2)$.

On top of the phosphor layer may optionally be arranged a filter material 22. The object of this filter material 21 is to receive at least part of the converted light emitted by the luminescent material 21 and at least part of the blue light from the first light source 20, which is transmitted unconverted through the luminescent material 21. Examples of suitable filter materials 22 include, but are not limited to Fe2O3, perylenes (PR 149-PV Fast Red) and anthraquinone (PR 177-Irgazin Red A2BN). One light source 20, which is configured as a light emitting diode, that produces the previously described distribution of light is part number LXM2-PL01-xxxx manufactured by Lumileds Holding B.V. However, other suitable light sources 20, luminescent materials 21, and/or filter materials 22 may be used in accordance with the present disclosure without limitation unless so indicated in the following claims.

Figure 11:
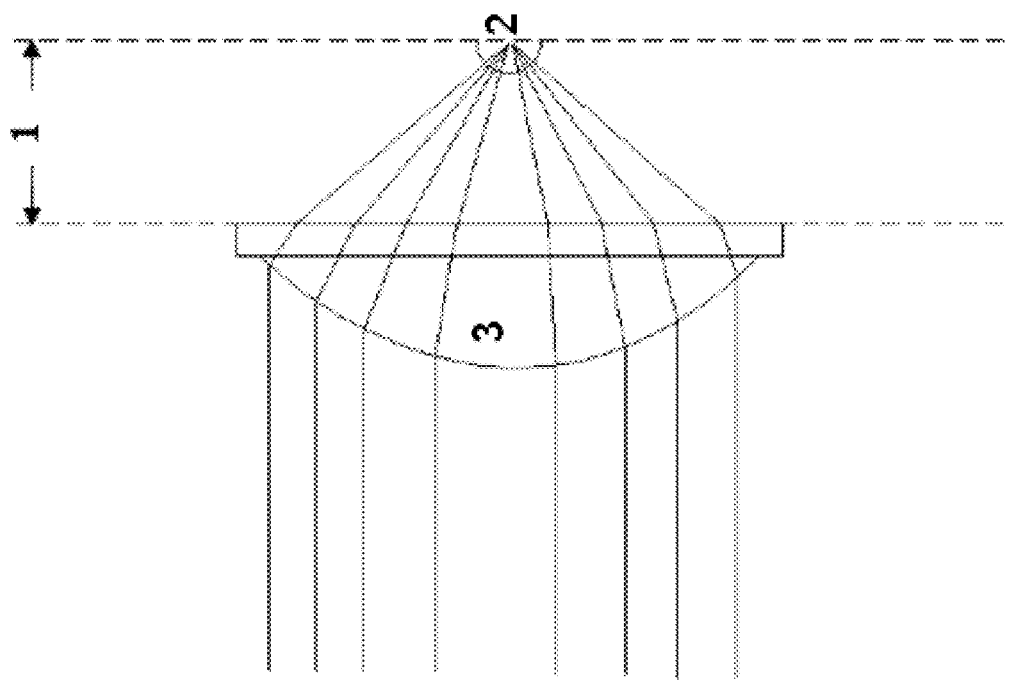
FIG. 11 is a schematic side view of an illustrative embodiment of an aspherical lens and light source that may be used with various embodiments of the portable lighting device.
Figure 12:
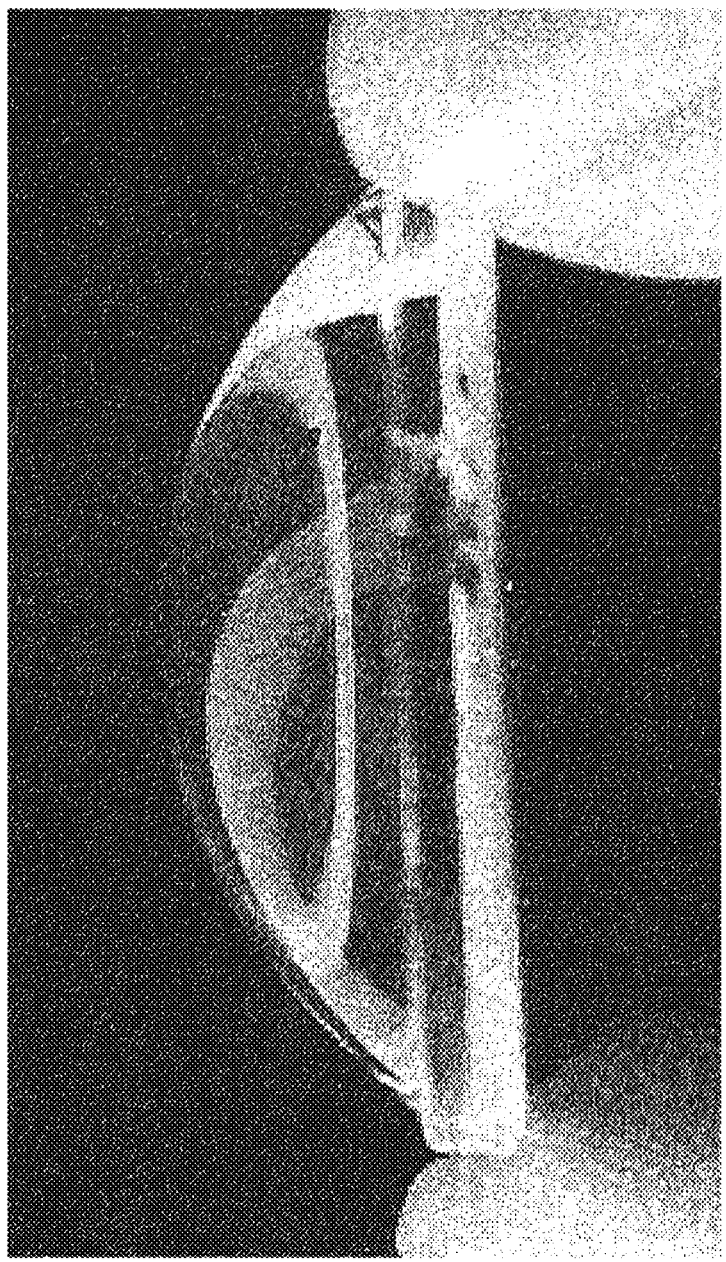
FIG. 12 is an elevational view of an illustrative embodiment of an aspherical lens collimator that may be used with various embodiments of the portable lighting device.

In a preferred embodiment of the portable lighting device, the light from the LED assembly 2 may pass through an optical element, which may be configured as an aspherical lens element, and which may serve to focus the light into a beam having little or no light outside of the brightest portion of the beam. A simplified diagram of an aspherical lens 3 positioned adjacent an LED assembly 2 is shown in FIG. 11. As previously described, the LED assembly 2 in this embodiment may use phosphors to convert substantially monochromatic light into a range of wavelengths that are generally greater than 550 nm. In the embodiment depicted in FIG. 11, the distance from the back of the plano-convex aspherical lens to the emitting surface of the LED assembly 2 (which distance is denoted as "1" in FIG. 11) may be configured such that it is less than the focal length of the aspherical lens 3. However, in other embodiments of the portable lighting device different optical elements (other than aspherical lens elements) may be used, as described below. Additionally, other types of aspherical lenses may be used without limitation. Accordingly, the scope of the portable lighting device is not limited to the specific optical element(s) positioned adjacent the LED assembly 2 unless so indicated in the following claims.

In another aspect of the portable lighting device, the light from the LED assembly may pass through an optical element configured as a spherical lens element, which may serve to focus the light into a beam having little or no light outside of the brightest portion of the beam. Again, the LED assembly in this embodiment may use phosphors to convert substantially monochromatic light into a range of wavelengths that are generally greater than 550 nm.

It is contemplated that various embodiments of the portable lighting device according to the present disclosure may be moved from one location to another by a single user. Such embodiments include but are not limited to a head lamp that may engage a helmet, hat, head, etc. of a user, another type of lamp that may be engaged with another portion of a user, including but not limited to a glove, outer garment, torso, etc., a lighting device that may be placed on a stand and/or a lighting device that may be placed and/or selectively positioned adjacent an area of interest the user desires to illuminate, a flash light and/or other portable lamp that may engage a helmet, hat, head, etc. of a user. The above listing of types of portable lighting devices is in no way limiting to the scope of the present disclosure, but is meant to provide some illustrative examples of portable lighting devices that may be configured according to aspects of the present disclosure.

Figure 13:
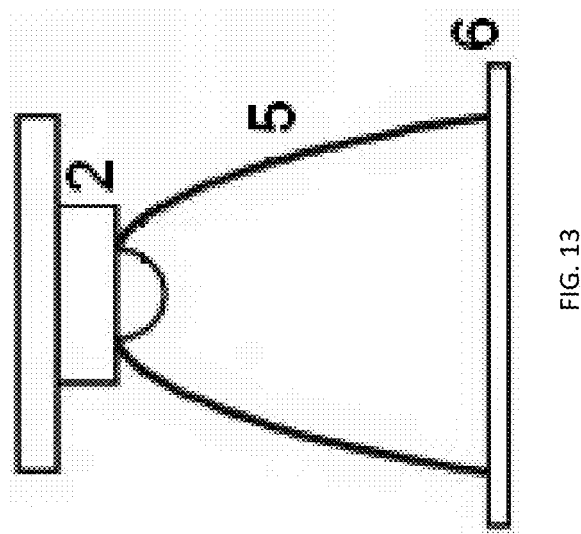
FIG. 13 is a schematic view of an illustrative embodiment of a reflector collimator configuration that may be used with various embodiments of the portable lighting device.

In another aspect of the portable lighting device, the light from the LED assembly may be reflected by a reflector as depicted in FIG. 13. Again, the LED assembly in this embodiment may use phosphors to convert substantially monochromatic light into a range of wavelengths that are generally greater than 550 nm.

In another aspect of the portable lighting device, the light from the LED assembly 2 may be reflected by a reflector 5 and some of the spill light may be substantially blocked by darkening of a selected portion of the lens 6 to reduce backscatter, a simplified schematic of which is shown in FIG. 13. In FIG. 13, it is contemplated that the top of the drawing may be adjacent the LED assembly 2, and the bottom of the drawing is where the light may exit the reflector 5. Again, the LED assembly 2 in this embodiment may use phosphors to convert substantially monochromatic light into a range of wavelengths that are generally greater than 550 nm.

In another aspect of the portable lighting device, the light from the LED assembly may be transmitted through an optic utilizing internal reflection to concentrate the light into a beam. Again, the LED assembly in this embodiment may use phosphors to convert substantially monochromatic light into a range of wavelengths that are generally greater than 550 nm.

In another aspect of the portable lighting device, the light from the LED assembly may be transmitted through an optic and some of the spill light may be substantially blocked to reduce backscatter. Again, the LED assembly in this embodiment may use phosphors to convert substantially monochromatic light into a range of wavelengths that are generally greater than 550 nm.

Figure 15:
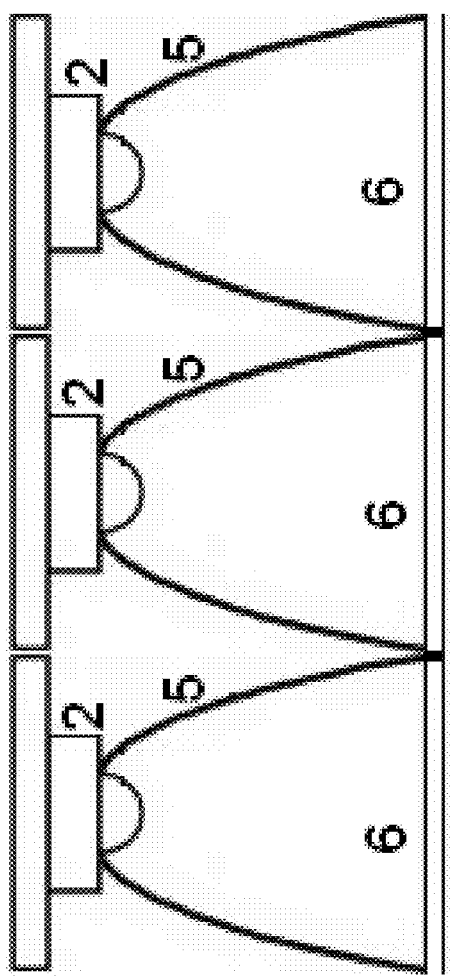
FIG. 15 is a schematic side view of an illustrative embodiment of a multiplicity of LED assemblies and reflectors.
Figure 16:
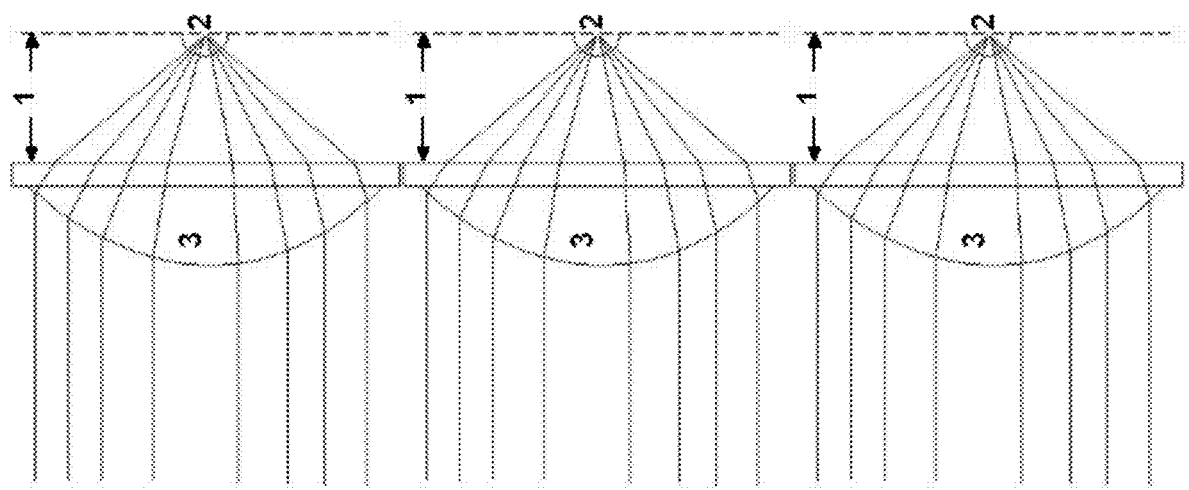
FIG. 16 is a schematic side view of an illustrative embodiment of a multiplicity of LED assemblies and plano-convex aspheric lenses.

In another aspect of the portable lighting device, light may be emitted by a plurality of LED assemblies 2, each having their own optical element 5 per one of the above embodiments as depicted in FIG. 15. The LED assemblies 2 in this embodiment may use phosphors to convert substantially monochromatic light into a range of wavelengths that are generally greater than 550 nm. Although the optical element associated with LED assembly 2 in the embodiment shown in FIG. 15 is configured as a reflector 5, other optical elements may be used with a plurality of LED assemblies 2 without limitation unless so indicated in the following claims.

In another aspect of the portable lighting device, a means may be provided for moving the optical element toward and away from the LED assembly in order to afford the user control over the extent to which the beam is focused or distributed such as by providing for a means of making the distance denoted as "1" in FIG. 11 adjustable by the user. Again, the LED assembly in this embodiment may use phosphors to convert substantially monochromatic light into a range of wavelengths that are generally greater than 550 nm.

In any embodiment of a portable lighting device, a secondary optical element of one of the above types may also be used with a primary optical element of one of the above types without limitation unless so indicated in the following claims.

In the claims, means-plus-function clauses are intended to cover both equivalent structures and structural equivalents of the structures described herein as performing the claimed function.

In the various illustrative embodiments of a portable lighting device disclosed herein, the portable lighting device may be configured to minimize the amount of light (which light may be substantially white light) scattered off airborne particulates suspended in a fluid, which light may otherwise blind and/or adversely affect the sight of a user of the portable lighting device. By manipulating the light spectrum emitted by the portable lighting device, the portable lighting device may minimize the region of the visible spectrum most reflected off a given type of particulate and simultaneously provide the user of the portable lighting device better visibility through good color rendition, depth perception, and penetration in the presence of a given type of particulate.

Accordingly, it is contemplated that various novel and nonobvious methods may result from use of one or more apparatuses according to the present disclosure. Such methods include, but are not limited to a method of optimizing vision comprising determining a particle size distribution for a particulate suspended in a fluid, wherein a user desires to view an object positioned in said fluid; selecting a light source that emits a spectrum of light that minimizes the intensity and amount of backscattered light and maximizes the intensity and amount of light that penetrates said particulate by correlating said particle size distribution with said spectrum of light; and, positioning said light source adjacent an optical element.

The materials used to construct the portable lighting device and various elements thereof will vary depending on the specific application of the portable lighting device, but it is contemplated that polymers, natural materials, metals and their alloys, and/or combinations thereof may be especially useful for some applications. Accordingly, the above-referenced elements may be constructed of any material known to those skilled in the art or later developed, which material is appropriate for the specific application of the portable lighting device, without departing from the spirit and scope of the portable lighting device as disclosed and claimed herein.

Having described the preferred embodiments, other features of the portable lighting device will undoubtedly occur to those of ordinary skill in the art, as will numerous modifications and alterations in the embodiments as illustrated herein, all of which may be achieved without departing from the spirit and scope of the portable lighting device disclosed herein. Accordingly, the methods and embodiments pictured and described herein are for illustrative purposes only, and are no way limiting to the scope of the portable lighting device unless so stated in the following claims.

It should be noted that the portable lighting device is not limited to the specific embodiments pictured and described herein, but are intended to apply to all similar apparatuses and methods for providing a portable lighting device. Modifications and alterations from the described embodiments will occur to those skilled in the art without departure from the spirit and scope of the portable lighting device. It is understood that the portable lighting device as disclosed herein extends to all alternative combinations of one or more of the individual features mentioned, evident from the text and/or drawings, and/or inherently disclosed. All of these different combinations constitute various alternative aspects of the portable lighting device and/or components thereof. The embodiments described herein explain the best modes known for practicing the portable lighting device and/or components thereof and will enable others skilled in the art to utilize the same. The claims are to be construed to include alternative embodiments to the extent permitted by the prior art.

While the portable lighting device has been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including but not limited to: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as illustrative only, with a true scope and spirit being indicated by the following claims.

The invention claimed is:

1. A portable lighting device comprising a light emitting diode assembly, wherein the light emitting diode assembly is comprised of a blue light-emitting diode that emits a blue light and on which is arranged a filter material arranged on a luminescent material to convert said blue light into a spectrum of light having greater than 0% and less than 10% of its relative radiant power at a wavelength below 530 nanometers and having greater than 50% and less than 100% of its relative radiant power throughout the range of wavelengths from 570 nanometers to 640 nanometers and no region throughout the range of wavelengths from 550 nanometers to 675 nanometers with a span of 25 nanometers having less than 5% of the total relative radiant power in a smoke-filled environment, wherein said luminescent material is selected from a group consisting of YAG:Ce and (Sr, Ca)$_2$SiO$_4$:Eu and aluminum garnet phosphors with the general formula $(Lu_{1-x-y-a-b}Y_xGd_y)_3(Al_{1-z}Ga_z)_5O_{12}$—:Ce$_a$Pr$_b$ wherein 0<x<1, 0<y<1, 0<z≤0.1, 0<a≤0.2 and 0<b≤0.1, including Lu$_3$Al$_5$O$_{12}$:Ce$^{3+}$ and Y$_3$Al$_5$O$_{12}$:Ce$^{3+}$; SrSi$_2$N$_2$O$_2$:Eu$^{2+}$; $(Sr_{1-u-v-x}Mg_uCa_vBa_x)(Ga_{2-y-z}Al_yIn_zS_4)$:Eu$^{2+}$ including, for example, SrGa$_2$S$_4$:Eu$^{2+}$; and Sr$_{1-x}$Ba$_x$SiO$_4$:Eu$^{2+}$ and Lu$_{3-x-y}$M$_y$Al$_{5-z}$A$_z$O$_{12}$:Ce$_x$ where M=Y, Gd, Tb, Pr, Sm, Dy; A=Ga, Sc; and 0<x≤0.2; Ca$_{3-x-y}$M$_y$Sc$_{2-z}$A$_z$Si$_3$O$_{12}$:Ce$_x$ where M=Y, Lu; A=Mg, Ga; and 0<x≤0.2; Ba$_{2-x-y}$MySiO$_4$:Eu$_x$ where M=Sr, Ca, Mg and 0<x≤0.2; Ba$_{2-x-y-z}$M$_y$K$_z$Si$_{1-z}$P$_z$O$_4$Eu$_x$ where M=Sr, Ca, Mg and 0<x≤0.2; Sr$_{1-x-y}$M$_y$Al$_{2-z}$Si$_z$O$_{4-z}$N$_z$:Eu$_x$ where M=Ba, Ca, Mg and 0<x≤0.2; M$_{1-x}$Si$_2$O$_2$N$_2$:Eu$_x$ where M=Sr, Ba, Ca, Mg and 0<x≤0.2; M$_{3-x}$Si$_6$O$_9$N$_4$:Eu$_x$ where M=Sr, Ba, Ca, Mg and 0<x≤0.2; M$_{3-x}$Si$_6$O$_{12}$N$_2$:Eu$_x$ where M=Sr, Ba, Ca, Mg and 0<x≤0.2; Sr$_{1-x-y}$M$_y$Ga$_{2-z}$Al$_z$S$_4$:Eu$_x$ where M=Ba, Ca, Mg and 0<x≤0.2; Ca$_{1-x-y-z}$M$_z$S:Ce$_xA_y$ where M=Ba, Sr, Mg; A=K, Na, Li; and 0<x≤0.2; Sr$_{1-x-z}$M$_z$Al$_{1+y}$Si$_{4.2-y}$N$_{7-y}$O$_{0.4+y}$:Eu$_x$ where M=Ba, Ca, Mg and 0<x≤0.2; Ca$_{1-x-y-z}$M$_y$Sc$_2$O$_4$:Ce$_xA_z$ where M=Ba, Sr, Mg; A=K, Na, Li; and 0<x≤0.2; M$_{x-z}$Si$_{6-y-2x}$Al$_{y+2x}$O$_yN_{8-y}$:Eu$_z$ where M=Ca, Sr, Mg and 0<x≤0.2; and Ca$_{8-x-y}$M$_y$MgSiO$_4$Cl$_2$:Eu$_x$ where M=Sr, Ba and 0<x≤0.2, and wherein the filter material consists of one or more materials selected from a group consisting of Fe$_2$O$_3$, perylenes including PR 149-PV Fast Red and anthraquinone PR 177-Irgazin Red A2BN.

2. The portable lighting device of claim 1, wherein said portable lighting device is configured in the form of a flashlight.

3. The portable lighting device of claim 1, wherein said portable lighting device comprises a plurality of said light emitting diode assemblies.

4. The portable lighting device of claim 1, wherein said spectrum of light is reflected by an optical element, wherein said optical element is a reflector.

5. The portable lighting device of claim 1, wherein said spectrum of emitted light is transmitted through an optical element, wherein said optical element is a plano-convex aspheric lens having a first focal length.

6. The portable lighting device of claim 1, wherein an optical element and said light emitting diode assembly are selectively moveable with respect to one another to vary the distance between a planar surface on said optical element and a light-emitting surface on said light emitting diode assembly.

7. The portable lighting device of claim 1, wherein the portable lighting device is configured to generate light of at least 25 lumens, with a corresponding illuminance of at least 5 lux at 1 meter.

8. A portable lighting device comprising a light emitting diode assembly, wherein the light emitting diode assembly is comprised of a blue light-emitting diode on which is arranged a luminescent material to convert said blue light into a spectrum of light having greater than 0% and less than 10% of its relative radiant power at a wavelength below 530 nanometers and having greater than 50% and less than 100% of its relative radiant power throughout the range of wavelengths from 570 nanometers to 640 nanometers and no region throughout the range of wavelengths from 550 nanometers to 675 nanometers with a span of 25 nanometers having less than 5% of the total relative radiant power in a smoke-filled environment, wherein said luminescent material is selected from a group consisting of YAG:Ce and (Sr, Ca)$_2$SiO$_4$:Eu and aluminum garnet phosphors with the general formula $(Lu_{1-x-y-a-b}Y_xGd_y)_3(A_{1-z}Ga_z)_5O_{12}$—:$Ce_aPr_b$ wherein 0<x<1, 0<y<1, 0<z≤0.1, 0<a≤0.2 and 0<b≤0.1, including $Lu_3Al_5O_{12}$:$Ce^{3+}$ and $Y_3Al_5O_{12}$:$Ce^{3+}$; $SrSi_2N_2O_2$:$Eu^{2+}$; $(Sr_{1-u-v-x}Mg_uCa_vBa_x)(Ga_{2-y-z}Al_yIn_zS_4)$:$Eu^{2+}$ including, for example, $SrGa_2S_4$:$Eu^{2+}$; and $Sr_{1-x}Ba_xSiO_4$:$Eu^{2+}$ and $Lu_{3-x-y}M_yAl_{5-z}A_zO_{12}$:$Ce_x$ where M=Y, Gd, Tb, Pr, Sm, Dy; A=Ga, Sc; and 0<x≤0.2; $Ca_{3-x-y}M_ySc_{2-z}A_zSi_3O_{12}$:$Ce_x$ where M=Y, Lu; A=Mg, Ga; and 0<x≤0.2; $Ba_{2-x-y}M_ySiO_4$:$Eu_x$ where M=Sr, Ca, Mg and 0<x≤0.2; $Ba_{2-x-y-z}M_yK_zSi_{1-z}P_zO_4Eu_x$ where M=Sr, Ca, Mg and 0<x≤0.2; $Sr_{1-x-y}M_yAl_{2-z}Si_zO_{4-z}N_z$:$Eu_x$ where M=Ba, Ca, Mg and 0<x≤0.2; $M_{1-x}Si_2O_2N_2$:$Eu_x$ where M=Sr, Ba, Ca, Mg and 0<x≤0.2; $M_{3-x}Si_6O_9N_4$:$Eu_x$ where M=Sr, Ba, Ca, Mg and 0<x≤0.2; $M_{3-x}Si_6O_{12}N_2$:$Eu_x$ where M=Sr, Ba, Ca, Mg and 0<x≤0.2; $Sr_{1-x-y}M_yGa_{2-z}Al_zS_4$:$Eu_x$ where M=Ba, Ca, Mg and 0<x≤0.2; $Ca_{1-x-y-z}M_zS$:$Ce_xA_y$ where M=Ba, Sr, Mg; A=K, Na, Li; and 0<x≤0.2; $Sr_{1-x-z}M_zAl_{1+y}Si_{4.2-y}N_{7-y}O_{0.4+y}$:$Eu_x$ where M=Ba, Ca, Mg and 0<x≤0.2; $Ca_{1-x-y-z}M_ySc_2O_4$:$Ce_xA_z$ where M=Ba, Sr, Mg; A=K, Na, Li; and 0<x≤0.2; $M_{x-z}Si_{6-y-2x}Al_{y+2x}O_yN_{8-y}$:$Eu_z$ where M=Ca, Sr, Mg and 0<x≤0.2; and $Ca_{8-x-y}M_yMgSiO_4Cl_2$:$Eu_x$ where M=Sr, Ba and 0<x≤0.2, and wherein the portable lighting device is configured to generate light of at least 25 lumens, with a corresponding illuminance of at least 5 lux at 1 meter.

9. The portable lighting device of claim 8, wherein said portable lighting device is configured in the form of a flashlight.

10. The portable lighting device of claim 8, wherein said portable lighting device comprises a plurality of said light emitting diode assemblies.

11. The portable lighting device of claim 8, wherein said spectrum of light is reflected by an optical element, wherein said optical element is a reflector.

12. The portable lighting device of claim 8, wherein said spectrum of emitted light is transmitted through an optical element, wherein said optical element is a plano-convex aspheric lens having a first focal length.

13. The portable lighting device of claim 12, wherein a portion of said plano-convex aspheric lens is configured with a planar surface.

14. The portable lighting device of claim 12, wherein said light emitting diode assembly is positioned adjacent said plano-convex aspheric lens, wherein said light emitting diode assembly has a light emitting surface, and wherein said portion of said planar surface and said light-emitting surface are separated by less than said first focal length.

15. The portable lighting device of claim 8, wherein an optical element and said light emitting diode assembly are selectively moveable with respect to one another to vary the distance between a planar surface on said optical element and a light-emitting surface on said light emitting diode assembly.

16. The portable lighting device of claim 8, wherein a portion of said plano-convex aspheric lens is configured with a planar surface.

17. The portable lighting device of claim 8, wherein said light emitting diode assembly is positioned adjacent said plano-convex aspheric lens, wherein said light emitting diode assembly has a light emitting surface, and wherein said portion of said planar surface and said light-emitting surface are separated by less than said first focal length.

* * * * *

UNITED STATES PATENT AND TRADEMARK OFFICE
CERTIFICATE OF CORRECTION

| | |
|---|---|
| PATENT NO. | : 10,955,109 B1 |
| APPLICATION NO. | : 15/908444 |
| DATED | : March 23, 2021 |
| INVENTOR(S) | : Courtney Joseph Monzyk |

It is certified that error appears in the above-identified patent and that said Letters Patent is hereby corrected as shown below:

In the Claims

In Column 12, Claim 1, Line 32 ", for example," should be omitted. In addition, in Column 13, Claim 8, Line 28 ", for example," should be omitted.

Signed and Sealed this
Seventh Day of February, 2023

Katherine Kelly Vidal
*Director of the United States Patent and Trademark Office*